(12) United States Patent
Mizuno et al.

(10) Patent No.: US 7,836,824 B2
(45) Date of Patent: Nov. 23, 2010

(54) METHOD AND APPARATUS FOR SCREEN PRINTING

(75) Inventors: Manabu Mizuno, Okazaki (JP); Ritsuo Hirukawa, Okazaki (JP)

(73) Assignee: Fuji Machine Mfg. Co., Ltd., Chiryu-shi (JP)

( * ) Notice: Subject to any disclaimer, the term of this patent is extended or adjusted under 35 U.S.C. 154(b) by 799 days.

(21) Appl. No.: 11/714,911

(22) Filed: Mar. 7, 2007

(65) Prior Publication Data

US 2007/0214976 A1 Sep. 20, 2007

(30) Foreign Application Priority Data

Mar. 15, 2006 (JP) .............................. 2006-070081

(51) Int. Cl.
*B05C 17/04* (2006.01)
(52) U.S. Cl. ...................................... 101/126; 101/123
(58) Field of Classification Search .................. 101/114, 101/123, 124, 126, 127.1, 129
See application file for complete search history.

(56) References Cited

U.S. PATENT DOCUMENTS 6,634,290 B1 * 10/2003 Shimizu et al. ............. 101/129
7,281,472 B2 * 10/2007 Sakaue et al. ............... 101/129

FOREIGN PATENT DOCUMENTS

| JP | 04-014288 A | 1/1992 |
|---|---|---|
| JP | 2000-000956 A | 1/2000 |

* cited by examiner

*Primary Examiner*—Ren Yan
(74) *Attorney, Agent, or Firm*—Foley & Lardner LLP

(57) ABSTRACT

When a printed circuit board is inspected and determined to have an insufficient amount of printing of a print pattern, the printed board is returned to a screen-printing apparatus so that a new print pattern is formed so as to overlap a previous print pattern. In the re-printing, a raising speed of the printed board at a final stage of the board raising operation is rendered lower than in the previous screen printing so that the printed board is brought into contact with the underside of the screen mask more slowly.

6 Claims, 4 Drawing Sheets

METHOD AND APPARATUS FOR SCREEN PRINTING

BACKGROUND OF THE INVENTION

1. Field of the Invention

The present invention relates to a screen-printing method in which a circuit board which has already been screen-printed is screen-printed again so that a new print pattern is formed on a previous pattern and a screen-printing apparatus carrying out the above-described method.

2. Description of the Related Art

Screen-printing apparatuses have generally been provided for screen-printing a solder pattern or the like on a circuit board. For example, JP-A-2000-956 discloses such a screen-printing apparatus in which a circuit board transferred below a screen mask is raised and held in contact with the underside of the screen mask. A squeegee brought into contact with an upper surface of the screen mask is moved so that the circuit board is screen-printed.

Defective printing occurs for some cause even when a normal print pattern is obtained by a single time of screen printing. Upon occurrence of such defective printing, a print pattern sometimes lacks of an amount of printing. As a countermeasure, in an inspection step of inspecting the print pattern of a screen-printed circuit board (hereinafter, "printed board") being transferred out of the screen-printing apparatus, it is determined by an inspection apparatus or an operator that an amount of printing is insufficient. In this case, the operator sometimes puts the printed board to the screen-operating apparatus again so that "re-printing" is carried out to overlap a new print pattern with the previous pattern.

In the re-printing, however, the solder etc. of the print pattern of the printed board is still wet. Accordingly, when the printed board transferred below a screen mask is raised and brought into contact with the underside of the screen mask, contact shock slightly vibrates or oscillates the screen mask, whereupon the shape of the solder etc. of the print pattern becomes misshapen and blurs. As a result, the printing quality is degraded and defective printing occurs. Furthermore, when solder or the like soils the underside of the screen mask, the underside of the screen mask needs to be cleaned frequently, whereupon the productivity is lowered.

SUMMARY OF THE INVENTION

Therefore, an object of the present invention is to provide a method of screen-printing which can prevent the screen mask from being minutely vibrated by the shock due to contact of the printed board with the underside of the screen mask in re-printing the printed board, thereby preventing the print pattern on the printed board from being blurred, and a screen-printing apparatus which can carry out the above-described method.

The present invention provides a screen-printing method in which a circuit board transferred below a screen mask is raised to be held in contact with an underside of the screen mask, and a squeegee brought into contact with an upper surface of the screen mask is moved so that the circuit board is screen-printed, the method comprising raising a previously printed circuit board (hereinafter referred to as "printed board") thereby to bring the printed board into contact with the underside of the screen mask when the printed board is to be screen-printed again so that a print pattern is formed so as to overlap a previous print pattern, wherein a raising speed of the printed board at a final stage of the board raising operation is rendered lower than in the previous screen printing so that the printed board is brought into contact with the underside of the screen mask more slowly.

According to the above-described method, in the re-printing, the raising speed of the printed board at the final stage of the board raising operation is rendered lower than in the previous screen printing so that the printed board is brought into contact with the underside of the screen mask more slowly. Consequently, the shock due to the contact of the printed board with the underside of the screen mask can be reduced, whereupon the screen mask can be prevented from minute vibration. Furthermore, since the printed pattern is prevented from being blurred by the minute vibration, the printing quality of reprint pattern can be improved. Since the underside of the screen mask is rendered harder to soil, the number of times of cleaning the underside of the screen mask can be reduced as compared with the conventional screen printing apparatuses. Consequently, the reduced number of times of cleaning can avoid a reduction in the production efficiency. Moreover, in the first screen printing which is free of the problem of blurred printed pattern due to minute vibration of the screen mask, the printed board can be raised and brought into contact with the underside of the screen mask at relatively higher speeds in one stroke. Consequently, the tact time can be prevented from being increased and the productivity of the screen printing can be prevented from being lowered.

One type of screen-printing apparatus has been provided in which a mask support plate is caused to contact the underside of the screen mask to hold the screen mask in a horizontal state. More specifically, the mask support plate is caused to contact a part of the screen mask underside which is not brought into contact with the circuit board. When re-printing is carried out using the screen-printing apparatus with the mask support plate, the mask support plate located on one side of the printed board is raised thereby to come into contact with the underside of the screen mask before the printed board is brought into contact with the underside of the screen mask. Furthermore, a squeegee is brought into contact with an upper surface of the screen mask, whereupon the screen mask is held between the squeegee and the mask support plate. Thereafter, the printed board may be raised into contact with the underside of the screen mask.

As the result of the above-described construction, the screen mask is held between the squeegee and the mask support plate thereby to be held therebetween before the printed board is brought into contact with the underside of the screen mask. Accordingly, the screen mask can be prevented from minute vibration, whereupon the print pattern can effectively be prevented from being blurred in the re-printing.

Furthermore, when the mask support plate located at the side of the printed board is raised into contact with the underside of the screen mask in the re-print, the mask support plate and the printed board are raised so that the mask support plate is brought into contact with the underside of the screen mask while the mask support plate is located higher by a predetermined dimension than the printed board, and subsequently, the raising speed of the printed board is reduced so that the printed board is brought into contact with the underside of the screen mask more slowly.

Consequently, it is rendered easier to control both operation for bringing the mask support plate into contact with the underside of the screen mask and operation for reducing the raising speed of the printed board so that the printed board is brought into contact with the underside of the screen mask more slowly.

Furthermore, in the re-printing, the raising speed of the printed board is reduced after a predetermined period of time from the contact of the mask support plate with the underside of the screen mask, so that the printed board starts to be brought into contact with the underside of the screen mask more slowly. Accordingly, the printed board can be brought into contact with the underside of the screen mask more slowly after minute vibration of the screen mask caused by contact of the mask support plate with the underside of the screen mask has sufficiently been attenuated. Consequently, the screen mask can improve the effect of preventing minute vibration, and the print pattern can more effectively be prevented from being blurred in the re-printing.

BRIEF DESCRIPTION OF THE DRAWINGS

Other objects, features and advantages of the present invention will become clear upon reviewing the following description of embodiment, with reference to the accompanying drawings, in which.

DETAILED DESCRIPTION OF THE INVENTION

Figure 1:
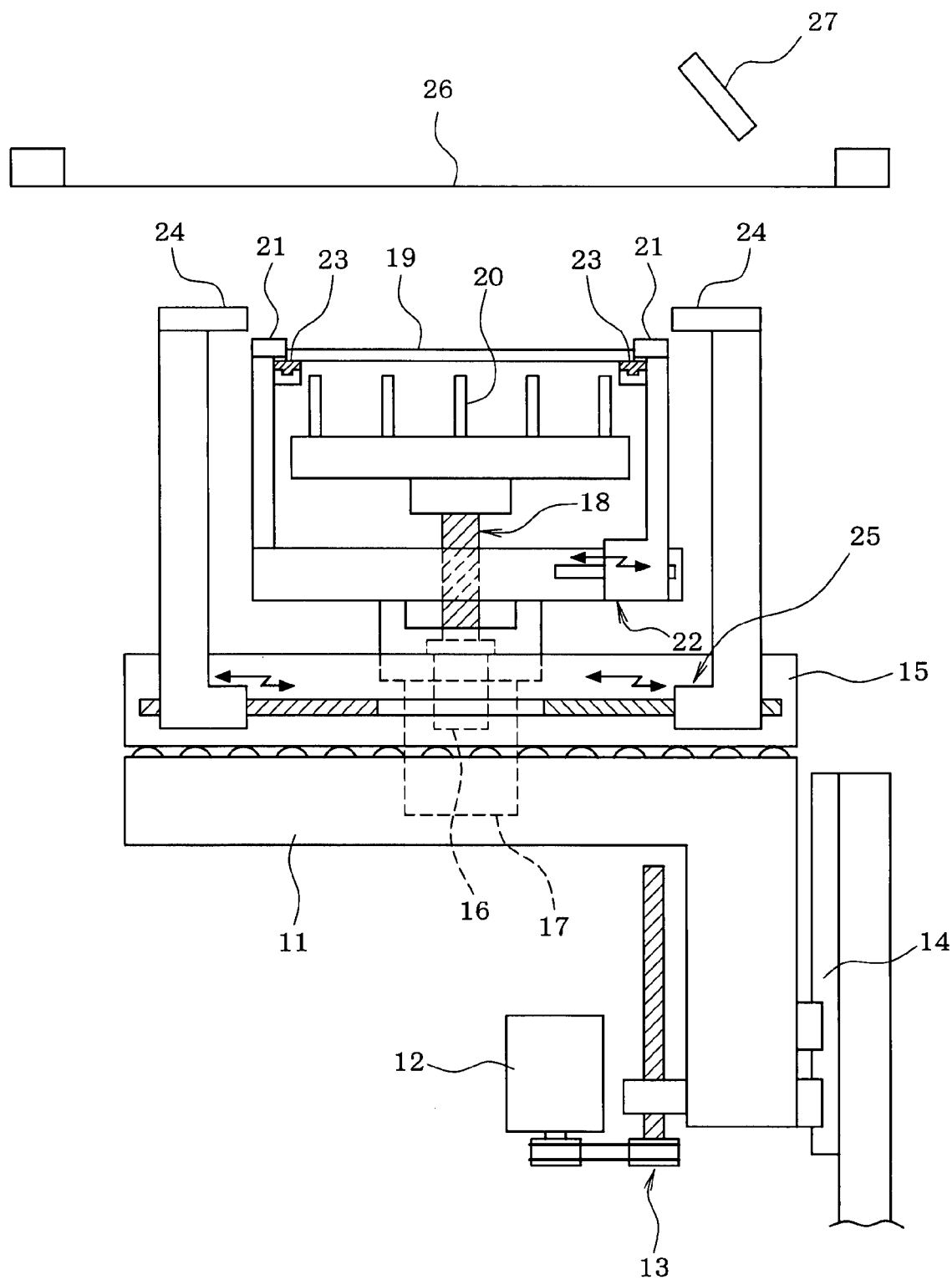
FIG. 1 is a schematic illustration of the construction of a screen-printing apparatus of one embodiment of the present invention.

One embodiment of the present invention will be described in detail. Firstly, the construction of the screen-printing apparatus will be described with reference to FIG. 1. The screen-printing apparatus includes a lifting table 11 slid vertically (in the Z-direction) along a lifting guide 14. The lifting table 11 is driven by a Z1-axis feed screw mechanism 13 which is further driven by a Z1-axis motor 12. The lifting table 11 includes a base 15 whose position is adjustable in the X-Y direction and a θ-direction. A Z2-axis motor 16 and a Z3-axis motor 17 are fixed to the base 15. The Z2-axis motor 16 drives a Z2-axis feed screw mechanism 18 so that a plurality of back-support pins 20 receiving and supporting the circuit board 19 from below are lifted up and down.

The Z3-axis motor 17 drives a Z3-axis feed screw mechanism (not shown) so that two side dampers 21 clamping both side edges of the circuit board 19 respectively are lifted up and down. A clearance between the side dampers 21 is adjusted by the feed screw mechanism 22 so as to be equal to a width of the circuit board 19 to be clamped. Two conveyor belts 23 are provided inside the side dampers 21 for carrying the circuit board 19 into and out of the screen-printing apparatus respectively. Both side edges of the circuit board 19 are adapted to be clamped by the side dampers 21 on the conveyor belts 23 respectively. Two mask support plates 24 are fixed to the base 15 so as to be adjacent to the side dampers 21 respectively. A clearance between the mask support plates 24 is adjusted by a feed screw mechanism 25. A screen mask 26 is disposed horizontally over the mask support plates 24 and the side dampers 21. A squeegee 27 is disposed above the screen mask 26.

Figure 2:
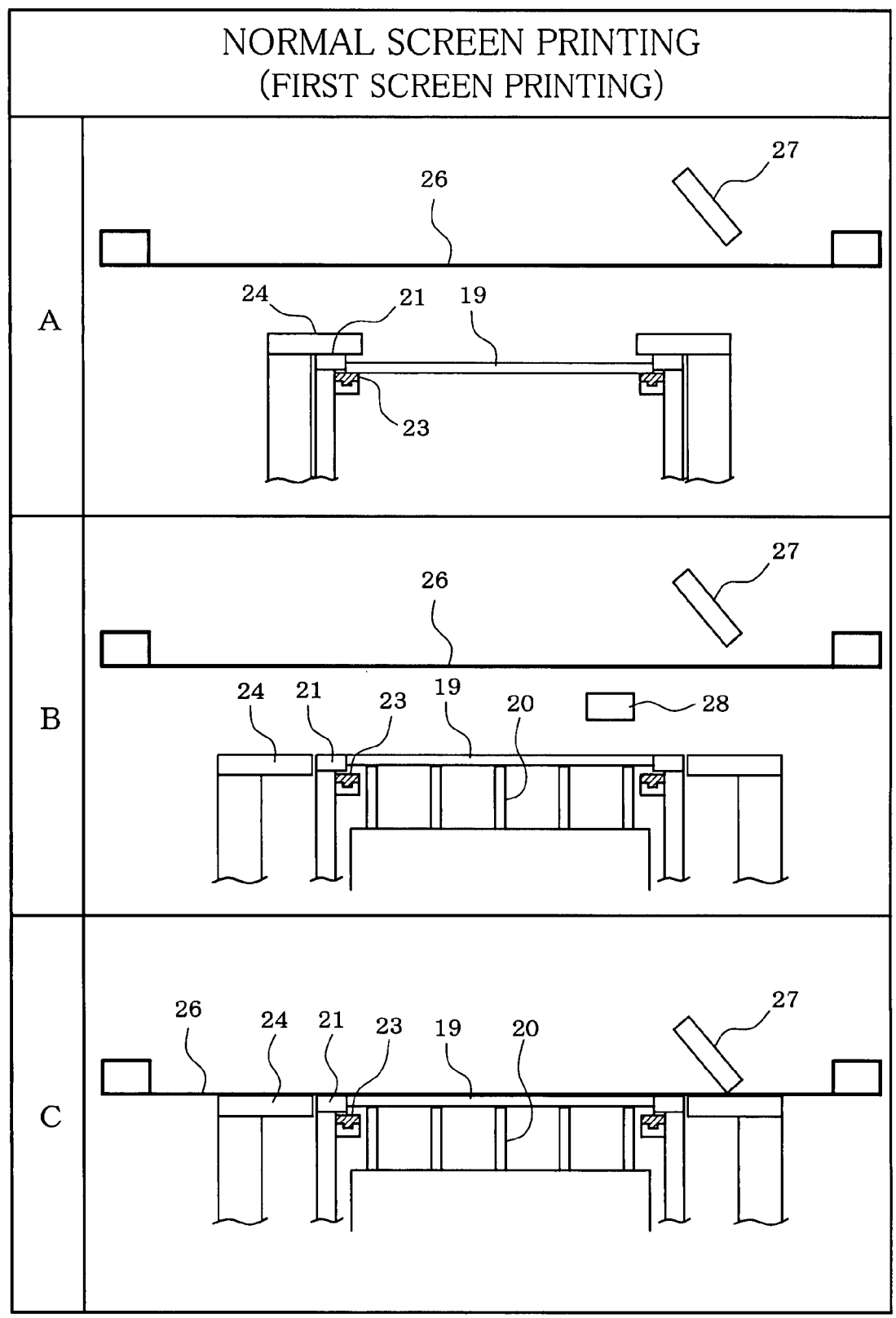
FIG. 2 illustrates an operation of the screen-printing apparatus in a normal screen printing (first screen printing)

The following will describe a screen-printing method by the use of the foregoing screen-printing apparatus. A print pattern of solder or the like is to be screen-printed on the circuit board 19 in the following description. To begin with, a first screen printing on the unprinted circuit board 19 will be described with reference to FIG. 2 (a normal print pattern is usually formed by the first screen printing). The clearance between both mask support plates 24 is previously narrowed so that distal ends of the mask support plates 24 project so as to be located inward relative to the side dampers 21 respectively as shown in FIG. 2-A. In this state, the circuit board 19 is carried to a predetermined printing position by the conveyor belts 23. When the printing position is reached, the conveyor belts 23 are stopped so that the circuit board 19 is stopped at a position over the back-support pins 20. Subsequently, the back-support pins 20 are lifted up by the Z2-axis motor 16 so that the circuit board 19 is knocked up by the back-support pins 20 from below, whereupon both ends of the circuit board 19 are abutted against the underside of the mask support plates 24 respectively. In this state, the clearance between the side clampers 21 is narrowed so that the both side edges of the circuit board 19 are clamped by the side dampers 21 respectively.

Subsequently, as shown in FIG. 2-B, the clearance between the mask support plates 24 is spread and the side dampers 21 are slightly lifted up by the Z3-axis motor 17. As a result, upper surfaces of the mask support plates 24 and the side clampers 21 and the circuit board 19 are on a level with each other. In this state, fiducial marks of the circuit board 19 and screen mask 26 are photographed by a fiducial mark camera 28, and the locations of the fiducial marks are recognized by an image processing technique. The location of the base 15 (circuit board 19) is adjusted with respect to the X-Y direction and/or θ-direction so that positional displacement between both fiducial marks is compensated for, whereby the fiducial marks are positioned with each other.

In the aforesaid state, the Z1-axis feed screw mechanism 13 is driven by the Z1-axis motor 12 so that the mask support plates 24, side dampers 21 and circuit board 19 are raised together at relatively higher speeds. The mask support plates 24, side dampers 21 and circuit board 19 are then stopped at locations where the mask support plates 24, side dampers 21 and circuit board 19 are in slight contact with the underside of the screen mask 26 as shown in FIG. 2-C. The squeegee 27 is lowered into contact with an upper surface of the screen mask 26 in parallel with or almost in tandem with the raising of the board. Subsequently, the squeegee 27 is moved along the upper surface of the screen mask 26 so that a print pattern of solder or the like is screen-printed on the upper surface of the circuit board 19.

After completion of the screen printing, the mask support plates 24, side dampers 21 and circuit board 19 are lowered together to the respective former locations. The circuit board 19 is released from clamping by the side dampers 21, and the screen-printed circuit board 19 (which will be referred to as "printed board") is carried out of the screen-printing apparatus by the conveyor belts 23.

The operator inspects the print pattern of the printed board 19 which is being carried out of the screen-printing apparatus. When determining that an amount of printing of the print pattern is insufficient, the operator returns the printed board 19 to the screen-printing apparatus so that re-printing is carried out in which a new print pattern is formed so as to overlap the previous print pattern of the printed board 19.

Figure 3A:
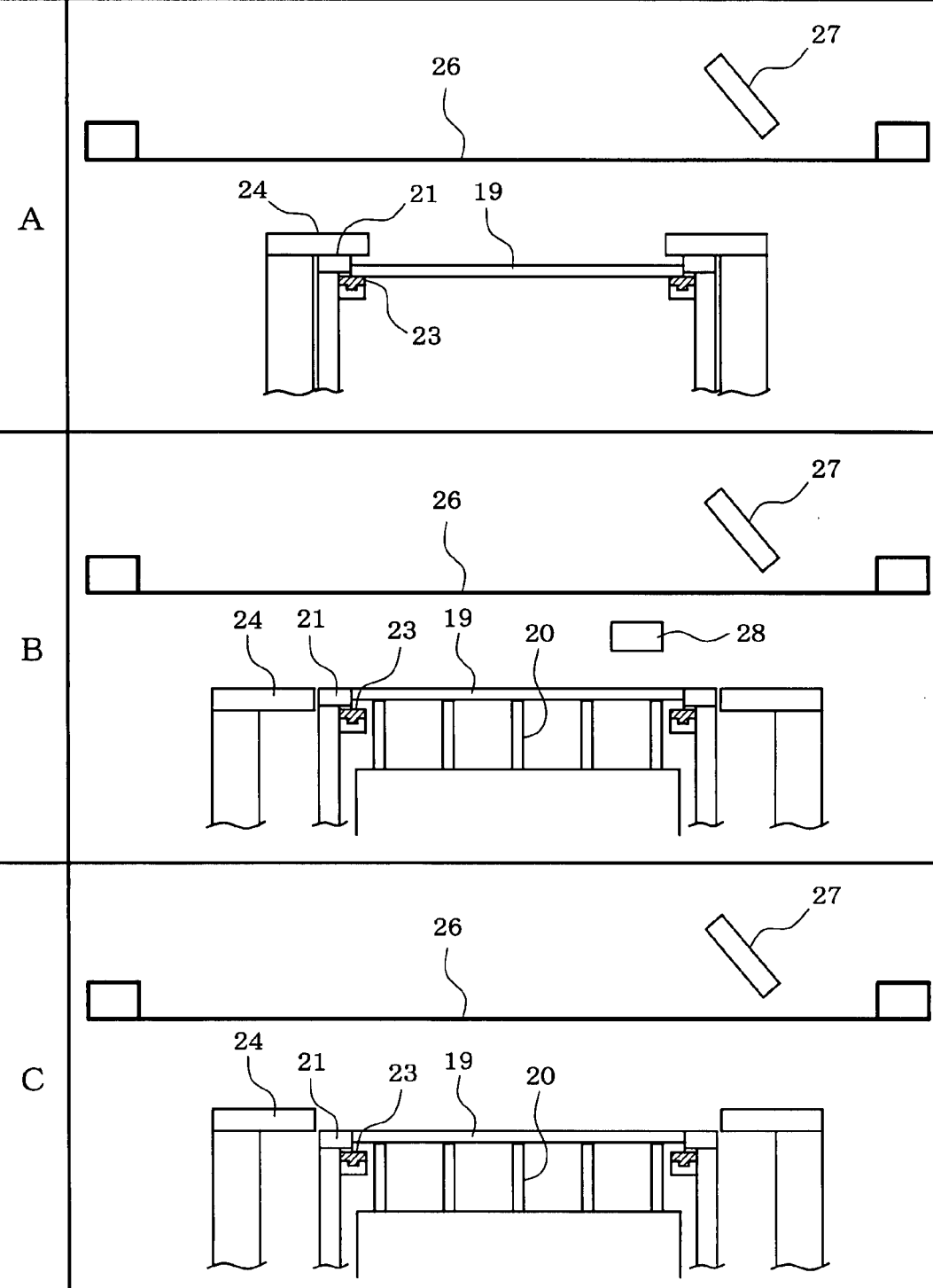
FIG. 3A illustrates an operation of the screen-printing apparatus in re-printing (second or subsequent screen printing) (part 1 of two parts)
Figure 3B:
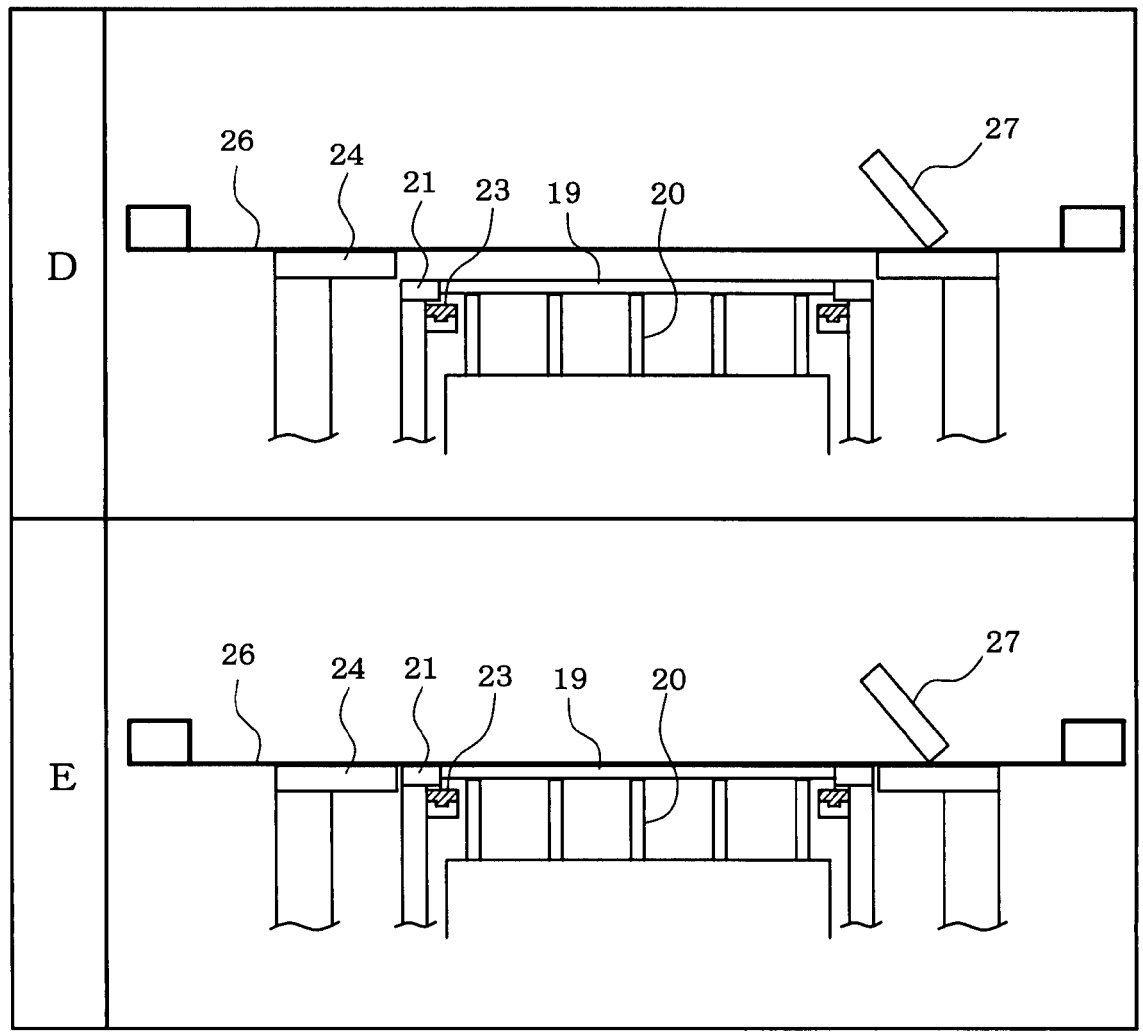
FIG. 3B illustrates an operation of the screen-printing apparatus in re-printing (second or subsequent screen printing) (part 2 of two parts).

The re-printing will be described with reference to FIGS. 3A and 3B. When re-printing is to be carried out, the operator keys an instruction of re-printing into a control computer (not shown) of the screen-printing apparatus so that a control mode of the screen-printing apparatus is switched from normal screen printing (first screen printing) to re-printing (second or subsequent screen-printing). In the re-printing, too, both side edges of the printed board 19 are clamped by the side dampers 21 respectively as shown in FIG. 3A-A and thereafter, the fiducial marks of the printed board 19 and screen mask 26 are photographed by the fiducial mark camera 28 so that the positional displacement between both marks is compensated for, as shown in FIG. 3A-B. The hitherto operation is the same as that in the normal screen printing (first screen printing).

Subsequently, as shown in FIG. 3A-C, the side dampers 21 and the printed board 19 are lowered together a predetermined amount by the Z3-axis motor 17, whereupon a predetermined amount of step is provided between the mask support plates 24 and the printed board 19. The step is preferably slightly larger than allowable warpage (usually, about 1 mm). For example, about 2 mm step is preferable although the printed board 19 needs to be located lower than the mask support plates 24.

Subsequently, the Z1-axis feed screw mechanism 13 is driven by the Z1-axis motor 12 so that the mask support plates 24, side clampers 21 and circuit board 19 are raised together at relatively higher speeds (which are usually the same as those in the normal screen printing). The mask support plates 24, side dampers 21 and circuit board 19 are then stopped at the location where the mask support plates 24 are in slight contact with the underside of the screen mask 26 as shown in FIG. 3B-D. The squeegee 27 is lowered into contact with an upper surface of the screen mask 26 in parallel with or almost in tandem with the raising of the mask support plates 24, side dampers 21 and circuit board 19. Consequently, the screen mask 26 is held between the squeegee 27 and the mask support plates 24.

The contact of the mask support plates 24 with the underside of the screen mask 26 results in minute vibration of the screen mask 26. Upon lapse of a predetermined time (about 0.2 sec., for example) necessary to attenuate the minute vibration, the Z3-axis motor 17 is driven so that the side dampers 21 and the printed board 19 are raised together by the predetermined amount of step. The side dampers 21 and the printed board 19 are stopped at locations where the upper surfaces of the side clampers 21 and the printed board 19 are in slight contact with the underside of the screen mask 26 as shown in FIG. 3B-E. A raising speed of the printed board 19 in this case is set so as to be lower than in the normal screen-printing (first screen-printing), whereupon the upper surfaces of the side dampers 21 and the printed board 19 are brought into contact with the underside of the screen mask 26 more slowly than in the normal screen-printing. Subsequently, the squeegee 27 is moved along the upper surface of the screen mask 26 so that a new print pattern is formed so as to overlap the previous print pattern. The control computer controls the operations of the screen-printing apparatus in the above-described normal screen printing (first screen printing) and the re-printing (second or subsequent screen printing). Thus, the control computer serves as a control unit.

According to the foregoing embodiment, in the re-printing, the printed board 19 is raised into contact with the underside of the screen mask 26. The raising speed of the printed board 19 at the final stage of the board raising operation is rendered lower than in the previous screen printing (first screen printing) so that the printed board 19 is brought into contact with the underside of the screen mask 26 more slowly. Consequently, the shock due to the contact of the printed board 19 with the underside of the screen mask 26 can be reduced, whereupon the screen mask 26 can be prevented from occurrence of minute vibration. Furthermore, since the print pattern is prevented from being blurred by the minute vibration of the screen mask 26, the printing quality of reprinted pattern can be improved. Since the underside of the screen mask 26 is rendered harder to soil, the number of times of cleaning the underside of the screen mask 26 can be reduced as compared with the conventional screen-printing apparatuses. Consequently, the reduced number of times of cleaning can avoid a reduction in the production efficiency. Moreover, in the normal or first screen printing which is free of the problem of blurred print pattern due to minute vibration of the screen mask 26, the printed board 19 can be raised and brought into contact with the underside of the screen mask 26 at relatively higher speeds in one stroke. Consequently, the tact time can be prevented from being increased and the productivity of the screen printing can be prevented from being lowered.

Furthermore, the screen mask 26 is held between the squeegee 27 and the mask support plates 24 thereby to be held therebetween before the printed board is brought into contact with the underside of the screen mask 26. Accordingly, the screen mask 26 can be prevented from minute vibration, whereupon the print pattern can effectively be prevented from being blurred in the re-printing.

Moreover, in the re-printing, the raising speed of the printed board 19 is reduced after lapse of the predetermined period of time from the contact of the mask support plates 24 with the underside of the screen mask 26, so that the printed board 19 starts to be brought into contact with the underside of the screen mask 26 more slowly. Accordingly, the printed board 19 can be brought into contact with the underside of the screen mask 26 more slowly after minute vibration of the screen mask 26 caused by contact of the mask support plates 24 with the underside of the screen mask 26 has sufficiently been attenuated. Consequently, the screen mask 26 can improve the effect of preventing minute vibration of the screen mask 26, and the print pattern can more effectively be prevented from being blurred in the re-printing.

However, in the re-printing, the printed board 19 may start slower raising immediately after the mask support plates 24 have been brought into contact with the underside of the screen mask 26, instead.

The invention may also be applied to a screen-printing apparatus which is not provided with the mask support plates 24. In this case, too, in the re-printing, the printed board 19 is raised into contact with the underside of the screen mask 26, and the raising speed of the printed board 19 at the final stage of the board raising operation is rendered lower than in the previous screen printing (first screen printing) so that the printed board 19 is brought into contact with the underside of the screen mask 26 more slowly.

Furthermore, the control mode of the screen-printing apparatus is switched from the normal screen printing (first screen printing) to the re-printing (second or subsequent screen printing) by the manual input by the operator in the foregoing embodiment. However, the screen-printing apparatus may be provided with a function of automatically discriminating between a printed circuit board and an unprinted circuit board by an image processing technique or the like, so that the control mode of the screen-printing apparatus is automatically switched between the normal screen printing and the re-printing based on the automatic discriminating function.

Additionally, the driving mechanism of the side dampers 21, the driving mechanism of the mask support plates 24, etc. may be modified.

The foregoing description and drawings are merely illustrative of the principles of the present invention and are not to be construed in a limiting sense. Various changes and modifications will become apparent to those of ordinary skill in the art. All such changes and modifications are seen to fall within the scope of the invention as defined by the appended claims.

This application claims priority from Japanese Patent Application No. 2006-070081, filed Mar. 15, 2006, which is incorporated herein by reference in its entirety.

What is claimed is:

1. A screen-printing method in which a circuit board transferred below a screen mask is raised to be retained in contact with an underside of the screen mask, and a squeegee brought into contact with an upper surface of the screen mask is moved so that the circuit board is screen-printed, the method comprising:

raising a previously printed circuit board (hereinafter referred to as "printed board") thereby to bring the printed board into contact with the underside of the screen mask when the printed board is to be screen-printed again so that a print pattern is formed so as to overlap a previous print pattern, wherein a raising speed of the printed board at a final stage of the printed board raising operation is rendered lower than in the previous screen printing so that the printed board is brought into contact with the underside of the screen mask more slowly, wherein a mask support plate located at a side of the printed board is raised thereby to be brought into contact with the underside of the screen mask before the printed board is brought into contact with the underside of the screen mask and subsequently, the printed board is raised to be brought into contact with the underside of the screen mask, and the squeegee is brought into contact with the upper surface of the screen mask so that the screen mask is held between the squeegee and the mask support plate.

2. The method according to claim 1, wherein when the mask support plate located at the side of the printed board is raised into contact with the underside of the screen mask in the re-printing, the mask support plate and the printed board are raised so that the mask support plate is brought into contact with the underside of the screen mask while the mask support plate is located higher by a predetermined dimension than the printed board, and subsequently, the raising speed of the printed board is reduced so that the printed board is brought into contact with the underside of the screen mask more slowly.

3. The method according to claim 2, wherein in the re-printing, the raising speed of the printed board is reduced after a predetermined period of time from the contact of the mask support plate with the underside of the screen mask, so that the printed board starts to be brought into contact with the underside of the screen mask more slowly.

4. A screen-printing apparatus comprising:

a screen mask;

a unit which raises a circuit board transferred below the screen mask thereby to hold the circuit board in contact with an underside of the screen mask;

a squeegee which is moved while being in contact with an upper surface of the screen mask so that the circuit board is screen-printed; and a control unit which controls a raising operation of the circuit board transferred below the screen mask, the control unit controlling the screen-printing apparatus so that when a previously printed circuit board (hereinafter referred to as "printed board") is to be screen-printed again so that a print pattern is formed so as to overlap a previous print pattern, the printed board is raised thereby to be brought into contact with the underside of the screen mask, and so that a raising speed of the printed board at a final stage of the printed board raising operation is rendered lower than in the previous screen printing so that the printed board is brought into contact with the underside of the screen mask more slowly, wherein the control unit controls the screen-printing apparatus so that a mask support plate located at a side of the printed board is raised thereby to be brought into contact with the underside of the screen mask before the printed board is brought into contact with the underside of the screen mask, and the squeegee is brought into contact with the upper surface of the screen mask so that the screen mask is held between the squeegee and the mask support plate and subsequently, the printed board is raised to be brought into contact with the underside of the screen mask.

5. The screen-printing apparatus according to claim 4, wherein the control unit controls the screen-printing apparatus so that when the mask support plate located at the side of the printed board is raised into contact with the underside of the screen mask in the re-printing, the mask support plate and the printed board are raised so that the mask support plate is brought into contact with the underside of the screen mask while the mask support plate is located higher by a predetermined dimension than the printed board, and subsequently, the raising speed of the printed board is reduced so that the printed board is brought into contact with the underside of the screen mask more slowly.

6. The screen-printing apparatus according to claim 5, wherein the control unit controls the screen-printing apparatus so that in the re-printing, the raising speed of the printed board is reduced after a predetermined period of time from the contact of the mask support plate with the underside of the screen mask, so that the printed board starts to be brought into contact with the underside of the screen mask more slowly.

* * * * *